(12) United States Patent
Ranganathan

(10) Patent No.: US 7,049,990 B2
(45) Date of Patent: May 23, 2006

(54) SINGLE LOOP FEED-FORWARD MODULATOR WITH SUMMING FLASH QUANTIZER AND MULTI-BIT FEEDBACK

(75) Inventor: Sumant Ranganathan, Sunnyvale, CA (US)

(73) Assignee: BROADCOM Corporation, Irvine, CA (US)

( * ) Notice: Subject to any disclaimer, the term of this patent is extended or adjusted under 35 U.S.C. 154(b) by 0 days.

(21) Appl. No.: 10/882,427

(22) Filed: Jul. 2, 2004

(65) Prior Publication Data

US 2005/0052300 A1 Mar. 10, 2005

Related U.S. Application Data

(60) Provisional application No. 60/500,374, filed on Sep. 5, 2003.

(51) Int. Cl.
*H03M 3/00* (2006.01)

(52) U.S. Cl. ........................ 341/143; 341/126

(58) Field of Classification Search ............... 341/143, 341/144, 150, 172, 161, 162, 155, 118, 120, 341/134, 156
See application file for complete search history.

(56) References Cited

U.S. PATENT DOCUMENTS

| | | | | |
|---|---|---|---|---|
| 6,147,551 A * | 11/2000 | Hong | | 327/554 |
| 6,362,770 B1 * | 3/2002 | Miller et al. | | 341/172 |
| 6,366,230 B1 * | 4/2002 | Zhang et al. | | 341/162 |
| 6,433,724 B1 * | 8/2002 | Confalonieri et al. | | 341/155 |
| 6,437,720 B1 * | 8/2002 | Yin et al. | | 341/150 |
| 6,577,258 B1 * | 6/2003 | Ruha et al. | | 341/143 |
| 6,765,520 B1 * | 7/2004 | Chuang et al. | | 341/143 |

* cited by examiner

*Primary Examiner*—Rex Barnie
*Assistant Examiner*—Joseph Lauture
(74) *Attorney, Agent, or Firm*—Sterne Kessler Goldstein & Fox, PLLC

(57) ABSTRACT

A sigma-delta modulator includes a summing junction that receives an input signal. A plurality of integrators are arranged in series, the integrators output an integrated signal value to a multi-input quantizer. The multi-input quantizer has a plurality of comparators each with switched capacitor inputs. The multi-input quantizer outputs a quantized signal to a multi-bit feedback DAC that drives the summing junction.

16 Claims, 6 Drawing Sheets

$$\frac{Y}{X} = \frac{c_1 b_1 (Z-1)^2 + c_1 b_2 (Z-1)^1 + c_1 b_3}{\left((Z-1)^3 + c_1 b_1 (Z-1)^2 + c_1 b_2 (Z-1)^1 + c_1 b_3\right)} = \text{STF}$$

$$\frac{Y}{Q} = \frac{(Z-1)^3}{\left((Z-1)^3 + c_1 b_1 (Z-1)^2 + c_1 b_2 (Z-1)^1 + c_1 b_3\right)} = \text{NTF}$$

$$\frac{Y}{X} = \frac{a_1 a_2 a_3}{((Z-1)^3 + b_3(Z-1)^2 + b_2 a_3(Z-1)^1 + b_1 a_2 a_3)}$$

$$\frac{Y}{Q} = \frac{(Z-1)^3}{((Z-1)^3 + b_3(Z-1)^2 + b_2 a_3(Z-1)^1 + b_1 a_2 a_3)}$$

If $(V_{1p}-V_{1n})*C_1 \geq (V_{refp}-V_{refn})*C_1 \rightarrow Y = 1$
If $(V_{1p}-V_{1n})*C_1 < (V_{refp}-V_{refn})*C_1 \rightarrow Y = 0$ If $2*(V_{1p}-V_{1n})*C_1 + (V_{2p}-V_{2n})*C_2 - (V_{3p}-V_{3n})*C_3 \geq (V_{refp}-V_{refn})*(C_2+C_3) \rightarrow Y = 1$
If $2*(V_{1p}-V_{1n})*C_1 + (V_{2p}-V_{2n})*C_2 - (V_{3p}-V_{3n})*C_3 < (V_{refp}-V_{refn})*(C_2+C_3) \rightarrow Y = 0$

SINGLE LOOP FEED-FORWARD MODULATOR WITH SUMMING FLASH QUANTIZER AND MULTI-BIT FEEDBACK

CROSS-REFERENCE TO RELATED APPLICATIONS

This application is claims priority to U.S. Provisional Patent Application No. 60/500,374, Filed: Sep. 5, 2003, entitled: Single Loop Feed-Forward Modulator with Summing Flash Quantizer and Multi-Bit FeedBack, which is incorporated by reference herein.

BACKGROUND OF THE INVENTION

1. Field of the Invention

The present invention relates to sigma-delta modulators used in analog-to-digital converters.

2. Related Art

Sigma-delta modulation is a noise shaping process that uses over-sampling and feedback to reduce the in-band quantization noise at the expense of boosting the noise outside the signal band of interest. This out-of-band noise is then filtered using digital filters. The extent of the noise shaping can be controlled by changing the order of the loop (L), which is the order of the high pass transfer function that shapes the noise, the over-sampling ratio ($F_{CLK}/2/F_{SIGNAL}$=M) and the number of levels in the quantizer (Q). FIG. 1 is a block diagram of a first order sigma-delta modulator (here, L=1). As shown in FIG. 1, the first order sigma-delta modulator includes a summing junction 101, an integrator 102, a quantizer 103, and a feedback DAC (digital to analog converter) 104, connected as shown. The Signal Transfer Function (STF) and Noise Transfer Function (NTF) of the first order sigma-delta modulator are defined as follows:

$$STF=Y(z)/X(z)$$

$$NTF=Y(z)/Q(z)$$

For a given L, M and Q there are different loop filter topologies to implement the NTF. Also, for a given set of specifications there are many different ways to implement a sigma-delta ADC (analog to digital converter).

The goal is to minimize the power and area when designing such a high order sigma-delta modulator with minimal design complexity. This becomes more important in fine line processes, where such ADC's are typically embedded inside a much larger chip, such as a single chip ADSL modem.

Higher order single loop architectures with single bit feedback have been used, which use both feedback and feed-forward loop filter topologies.

Their highly non-linear behavior makes it difficult to design stable modulators. Over load limit of single-bit delta-sigma modulators is inherently poor. Single bit delta-sigma modulators are unstable for signals significantly smaller than the full-scale reference, and have much lower dynamic range than ideally possible. Reference voltages need to be large, and KT/C noise from reference voltage capacitors is also large. This, in turn, results in increased noise for a given full-scale conversion, or larger power consumption and a lot of area taken up for the same noise performance.

Higher order single loop with feedback architecture and distributed multi-bit feedback DAC's have also been used (see, e.g., FIG. 2, showing an example implementation of a third order loop filter). The third order loop filter includes a number of summing junctions 101A–101C, a number of integrators 102A–102C, a quantizer 103, a number of feedback DAC's 104, all connected as shown. (Boxes with "a" and "b" represent multiplication by a constant). Such a structure typically results in very low gain in the first integrator 102A in FIG. 2. If the first integrator gain is low then the feedback capacitor will be large. For example: $G_i$=0.25→$C_{fb}$=$C_{in}$/$G_i$=4*$C_{in}$.

Multiple multibit DAC's are needed in the feedback path. Multi-bit DAC's need some sort of linearization scheme to maintain high linearity in the overall modulator. For multiple DAC's, this results in an added cost of linearization. First and second order single bit feedback stages can be cascaded, however, extremely high gain, high speed op amps for integrators (>80 dB over all corners) have to be used. It is difficult to achieve linearity over a large output dynamic range, and this approach often results in increased power consumption and area usage.

FIG. 3 shows a feed forward loop filter architecture that utilizes a summing junction 101, integrators 102A–102C, a quantizer 103, a feedback DAC 104, and a summer 301. Note that a single loop feed forward architecture with multi-bit feedback DAC's is shown in FIG. 3.

For the same third order loop filter used in FIG. 3, the feed forward architecture results in significantly higher gain for the first integrator and low attenuation in the signal path results in near ideal dynamic range. This results in significantly smaller integrator caps and hence smaller area.

Also, the integrator amplifiers have a smaller load and hence can be lower in power and area. Only one multi-bit feedback DAC is used.

The multi-bit quantizer has a linear gain, which improves the overload limit of the modulator and hence helps achieve near ideal dynamic range. Reference need not be over designed much larger than necessary. KT/C noise from reference capacitors is reduced. Fewer circuits (DAC's and linearization circuits) are needed, and the design of all integrators after the first is simplified, resulting in a lower area used by the circuit.

An extra summing amplifier is necessary before the flash quantizer (see FIG. 4). This puts tight timing constraints on the loop because of the delay through this stage. Large power and area overhead for this amplifier is needed, since the amplifier needs to accurately reproduce the outputs of all the integrators.

An n bit analog to digital converter (ADC) converts an analog voltage into one of $2^n$ digital levels (represented by an "n" bit binary number, although sometimes n can be fractional, to result in a number of digital levels that is not a power of n, e.g., 17). A flash ADC uses $2^n-1$ comparators (an example is shown in FIG. 4 as comparator 401) simultaneously to compare the input voltage to all the $2^n-1$ reference levels and produces a thermometer-coded digital version of the input signal voltage (all the comparator 401 outputs for which the input is larger than the reference levels will be 1, and all the outputs for which the input signal is less than the reference levels will be 0). Each of the individual comparators 401 has 2 inputs and one output, and performs the following function:

If $V_1 > V_{ref}$ → Y=1

If $V_1 < V_{ref}$ → Y=0 where $V_1$ is the input signal, $V_{ref}$ is the reference input to that comparator 101, and Y is the digital ouput of the comparator 401. In other words, FIG. 4 shows a conventional fully differential switched capacitor comparator 401.

Here the input voltage ($V_{1p}$, $V_{1n}$) is sampled during phase 1 ($\phi_1$) on the capacitors ($C_{1p}$, $C_{1n}$) and in phase 2 ($\phi_2$) the same capacitors $C_{1p}$, $C_{1n}$ are switched over to the reference voltage ($V_{refp}$, $V_{refn}$). The difference in charge (($V_{1p}-V_{1n}$) *$C_1$−($V_{refp}-V_{refn}$)*$C_1$ drives the summing junction of the comparator 401 positve or negative, and that is voltage amplified/regenerated in a latch inside the comparator 401 to generate the digital signal Y.

For a given noise specification, the input capacitors' $C_{1p}$, $C_{1n}$ size is fixed based on KT/C noise and offset considerations.

The actual analog signal input to the flash ADC can be an algebraic expression of several other analog inputs:

$$Y = A_1 * S_1 + A_2 * S_2 + A_3 * S_3 + A_4 * S_4 + \ldots \quad \text{(Equation 1)}$$

where $A_1$, $A_2$, $A_3$ are constants and $S_1$, $S_2$, $S_3$ are the various signals. A summing block is conventionally used to perform the algebraic function in equation 1, to result in a single output Y, which can then be digitized using a regular flash ADC. This summing amplifier needs to maintain the signal integrity to a high degree for precision applications, and is very power-hungry and requires significant area.

SUMMARY OF THE INVENTION

In an embodiment, the present invention is directed to a single loop feed-forward modulator with summing flash quantizer and multi-bit feedback that substantially obviates one or more of the problems and disadvantages of the related art.

There is provided a sigma-delta modulator including a summing junction that receives an input signal. A plurality of integrators are arranged in series, the integrators output an integrated signal value to a multi-input quantizer. The multi-input quantizer has a plurality of comparators each with switched capacitor inputs. The multi-input quantizer outputs a quantized signal to a multi-bit feedback DAC that drives the summing junction.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

A flash quantizer with multiple inputs is used, to avoid using an extra summing amplifier, and hence ease the timing constraints in a feedback loop of the sigma delta modulator, and provide area and power savings to the design. Higher order single loop feed forward architecture using a flash quantizer with multiple inputs and multi-bit feedback DAC's can be used, as shown in FIG. 5.

Figure 5:
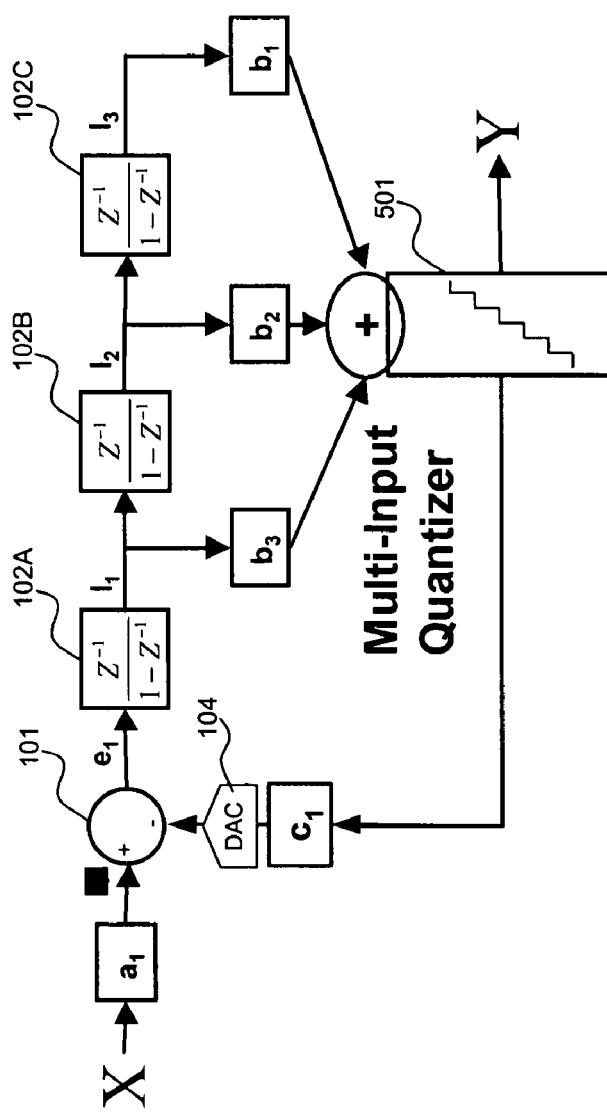
FIG. 5 shows a single loop feed forward architecture of the present invention.
Figure 6:
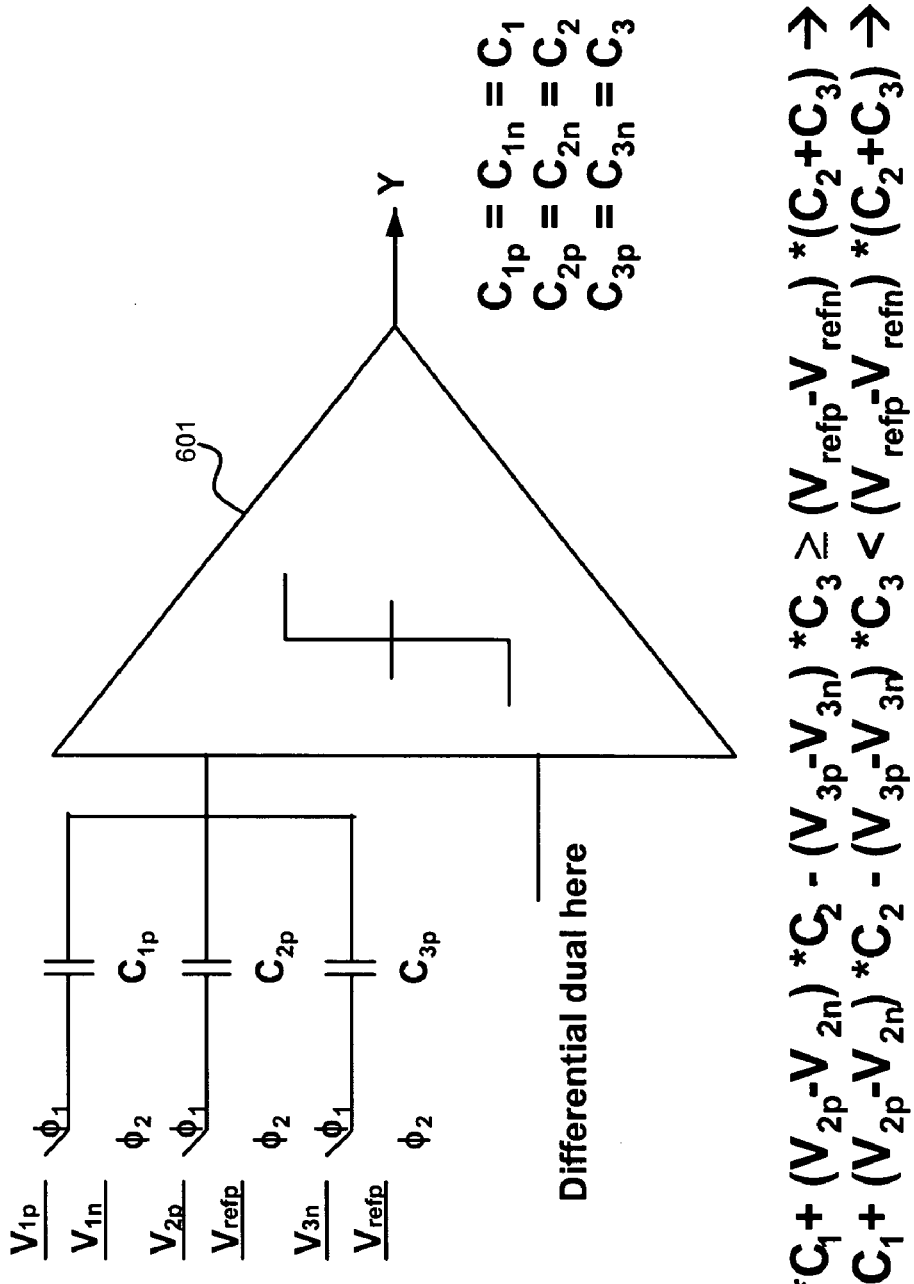
FIG. 6 shows a block diagram of a combined summer/quantizer of FIG. 5.

FIG. 5 shows a single loop feed forward architecture of the present invention. FIG. 6 shows a block diagram of a single comparator used in a summer/quantizer 501 of FIG. 5. As shown in FIG. 5, instead of using a summer before inputting the values into the quantizer, a single multi-input quantizer 501 with multiple switched capacitor inputs is used. The comparator can optionally include a preamplifier connected to the inputs, followed by a latch, such that the preamplifier includes a high gain amplifier.

Figure 1:
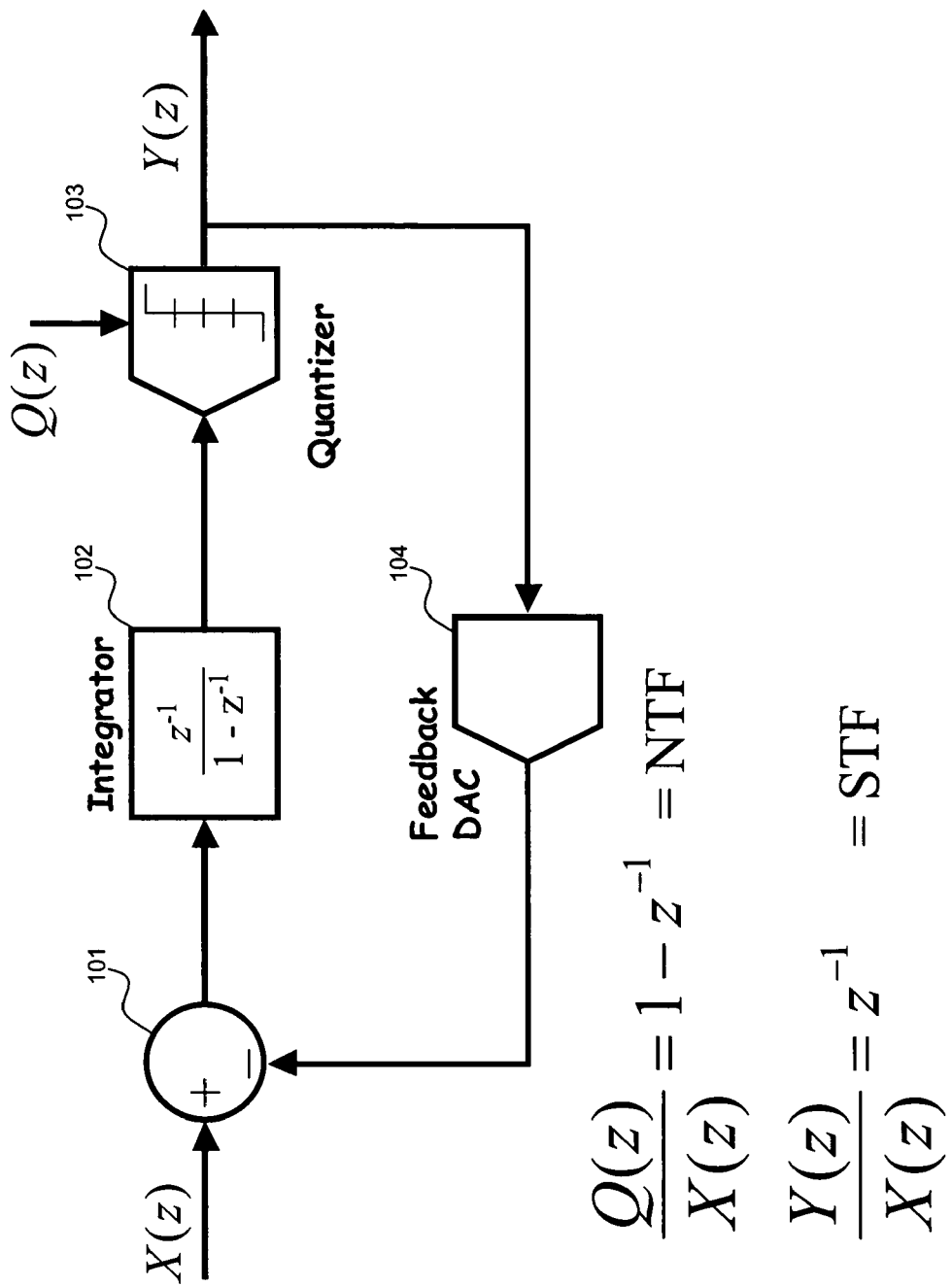
FIG. 1 is a block diagram of a conventional first order sigma-delta modulator.
Figure 2:
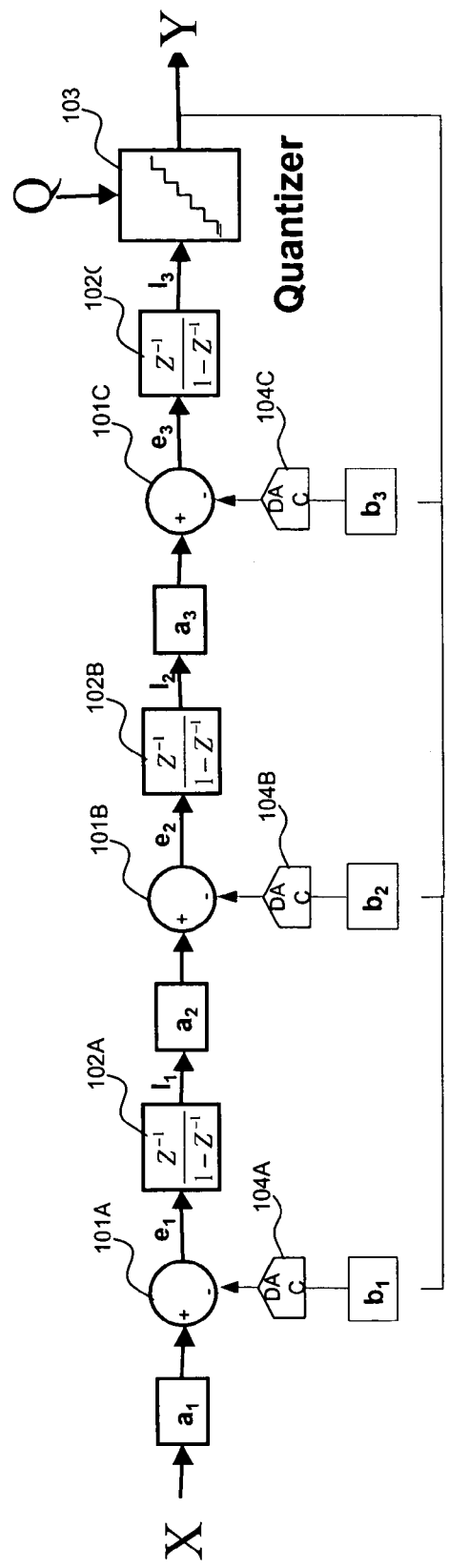
FIG. 2 shows a conventional implementation of a third order loop filter.
Figure 3:
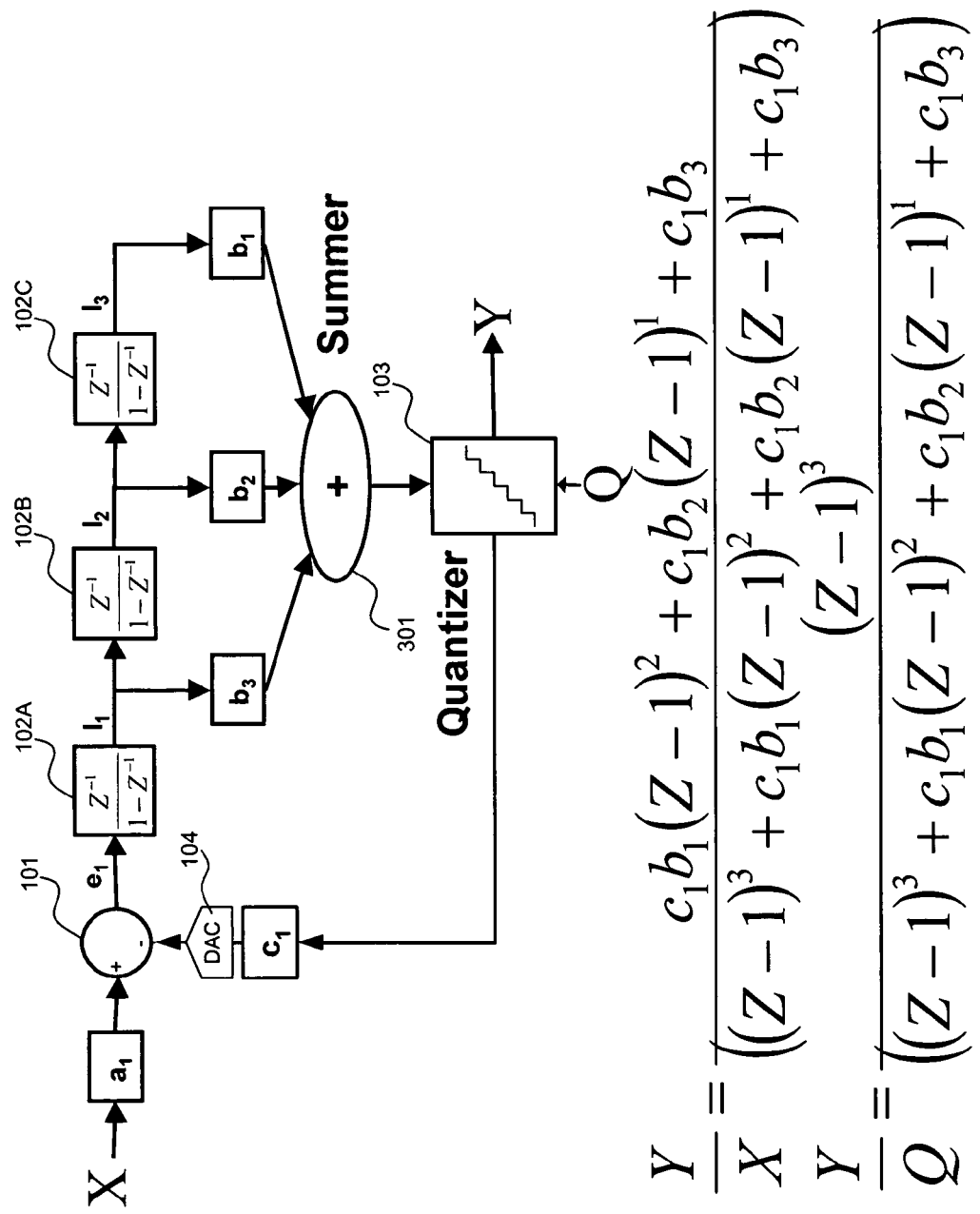
FIG. 3 shows a conventional single loop feed forward architecture with multi-bit feedback DAC's.
Figure 4:
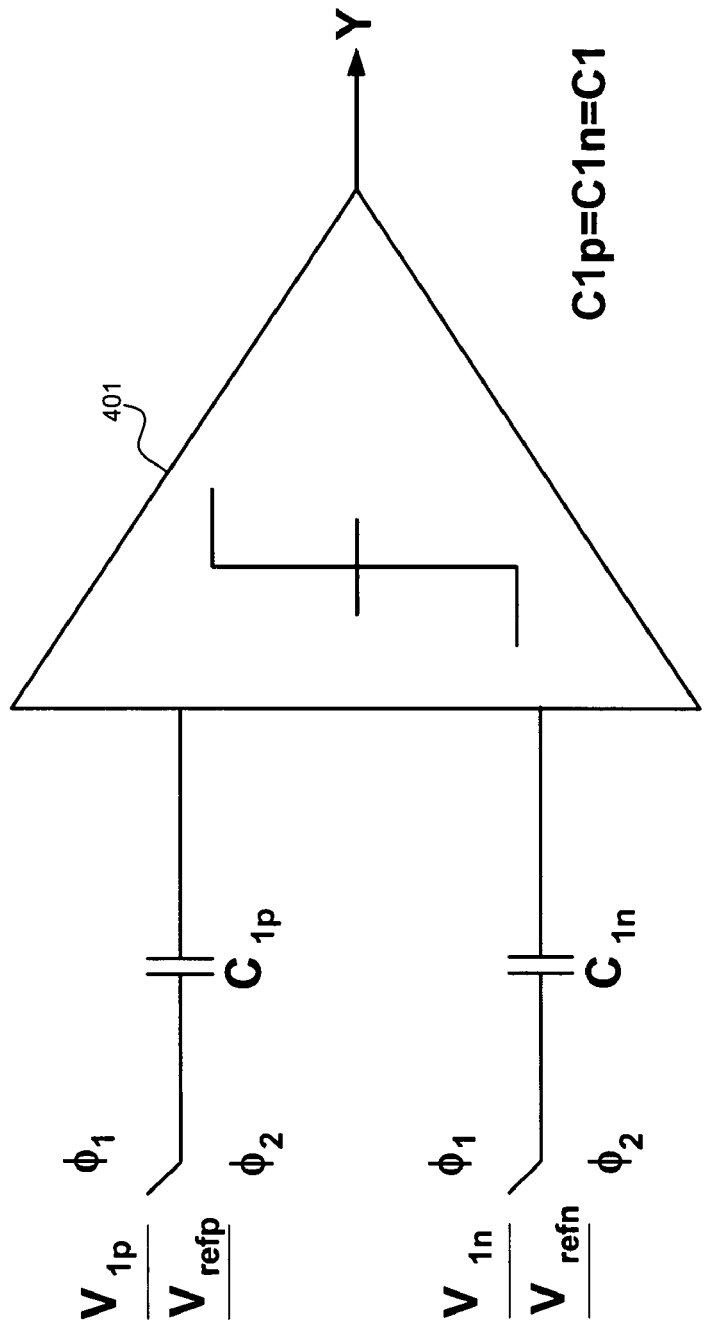
FIG. 4 shows a conventional fully differential switched capacitor comparator.

The flash quantizer 501 with multiple inputs removes the need for an extra stage just to sum the outputs of the three integrators. It also eases the timing constraints on the feedback loop. Lower power and area are needed to implement than using extra summer 301 plus separate single input flash quantizer 103 of FIG. 3.

FIG. 6 shows a single comparator 601, out of multiple comparators used in the quantizer 501.

The present invention removes the need for an extra stage just to sum the outputs of the multiple outputs of the integrators 102A–102C in FIG. 5. The algebraic function in equation 1 can be implemented by using different sizes for the capacitors in each of the input paths and by appropriately choosing the inputs to be sampled in both phases $\phi_1$, $\phi_2$.

In the circuit of FIG. 6, by scaling $C_1$, $C_2$, $C_3$, . . . , and by appropriately choosing the inputs in $\phi_1$ and $\phi_2$, any algebraic expression, such as equation 1 and the quantizer function, can be implemented, in just one low-power block.

Thus, the flash quantizer 501 with multiple switched-capacitor inputs is used to avoid extra summing amplifier, to provide area and power savings, and also to ease the timing constraints in feedback loops.

Accuracy is only important for the comparator 601 when it near its zero crossing and even that does not have to be extremely accurate, since its errors are shaped by the loop NTF when referred back to the input.

The proposed approach eases the timing constraints when used inside feedback loops, such as in sigma-delta converters. Lower power and area are needed to implement the invention compared to using an extra summing amplifier 401 plus separate single input flash quantizer 103.

Although the embodiment described above uses capacitors to implement the comparator transfer function, resistors can also be used in an alternative embodiment. For example, in FIG. 6, the capacitors $C_{1p}$, $C_{2p}$, $C_{3p}$ can be replaced with corresponding resistors (not shown in the figures and the switches would be removed for this embodiment), so that each resistor connects to its own reference voltage or corresponding input voltage. (This would, obviously, result in a different transfer function). As yet another alternative, the resistors could be connected to produce in the same transfer function as shown in FIG. 6.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A sigma-delta modulator comprising:
   a summing junction receiving an input signal;
   a plurality of integrators in series, the integrators outputting an integrated signal value to a multi-input quantizer; and
   wherein the multi-input quantizer has a plurality of comparators each with switched capacitor inputs, and
   wherein the multi-input quantizer outputs a quantized signal to a multi-bit feedback DAC whose output drives the summing junction and, wherein each comparator implements a function $Y=A_1*S_1+A_2*S_2+A_3*S_3+A_4*S_4+$, ... where Y is the output of the comparator, $A_1, A_2, A_3$ ... are constants, and $S_1, S_2, S_3$ ... are input voltages.

2. The sigma-delta modulator of claim 1, wherein the sigma-delta modulator is a feed-forward modulator.

3. The sigma-delta modulator of claim 1, wherein the quantized signal is a multi-level quantized signal.

4. The sigma-delta modulator of claim 1, wherein each comparator of the plurality of comparators included in the multi-input quantizer comprises:
   a first input and a second input, and an output;
   a first plurality of capacitors connected to the first input acting as a summing junction, wherein each capacitor of the first plurality of capacitors is connected through a switch to one of a corresponding reference voltage and a corresponding input voltage; and
   a second plurality of capacitors connected to the second input acting as a summing junction, wherein each capacitor of the second plurality of capacitors is connected through a switch to one of a corresponding reference voltage and a corresponding input voltage.

5. The sigma-delta modulator of claim 1, wherein the multi-input quantizer outputs the quantized signal to a single multi-bit feedback DAC.

6. The sigma-delta modulator of claim 1, wherein each comparator of the plurality of comparators included in the multi-input quantizer comprises:
   a first plurality of inputs and a second plurality of inputs, and an output;
   a first plurality of capacitors connected between the first plurality of inputs and a first summing junction, wherein each capacitor of the first plurality of capacitors is connected through a switch to one of a corresponding reference voltage and a corresponding input voltage; and
   a second plurality of capacitors connected between the second plurality of inputs and a second summing junction, wherein each capacitor of the second plurality of capacitors is connected through a switch to one of a corresponding reference voltage and a corresponding input voltage.

7. A multi-input comparator comprising:
   a first plurality of inputs and a second plurality of inputs, and an output;
   a first plurality of capacitors connected between the first plurality of inputs and a first summing junction, wherein each capacitor of the first plurality of capacitors is connected through a switch to one of a corresponding reference voltage and a corresponding input voltage; and
   a second plurality of capacitors connected between the second plurality of inputs and a second summing junction, wherein each capacitor of the second plurality of capacitors is connected through a switch to one of a corresponding reference voltage and a corresponding input voltage and, wherein the comparator implements a function $Y=A_1*S_1+A_2*S_2+A_3*S_3+A_4*S_4+$ ..., where Y is the output of the comparator, $A_1, A_2, A_3$ ... are constants, and $S_1, S_2, S_3$ ... are input voltages.

8. The comparator of claim 7, wherein the comparator comprises a preamplifier connected to the first and second inputs, followed by a latch, such that the preamplifier includes a high gain amplifier.

9. The comparator of claim 7, wherein the comparator is included in a multi-input quantizer, wherein the quantizer outputs a multi-level quantized signal.

10. A multi-input comparator comprising:
    a first input and a second input, and an output;
    a first plurality of capacitors connected to the first input, wherein each capacitor of the first plurality of capacitors is connected through a switch to one of a corresponding reference voltage and a corresponding input voltage; and
    a second plurality of capacitors connected to the second input, wherein each capacitor of the second plurality of capacitors is connected through a switch to one of a corresponding reference voltage and a corresponding input voltage,
    wherein the comparator implements a function $Y=A_1*S_1+A_2*S_2+A_3*S_3+A_4*S_4+$ ...

where Y is the output of the comparator, $A_1, A_2, A_3$ ... are constants and $S_1, S_2, S_3$ ... are the input voltages.

11. The comparator of claim 10, wherein the comparator is included in a multi-input quantizer, wherein the quantizer outputs a multi-level quantized signal.

12. A sigma-delta modulator comprising:
    a summing junction receiving an input signal;
    a plurality of integrators in series, the integrators outputting an integrated signal value to a multi-input quantizer; and
    wherein the multi-input quantizer has a plurality of comparators each with resistor inputs, and
    wherein the multi-input quantizer outputs a quantized signal to a multi-bit feedback DAC whose output drives the summing junction and, wherein each comparator implements a function $Y=A_1*S_1+A_2*S_2+A_3*S_3+A_4*S_4+$, ... where Y is the output of the comparator, $A_1, A_2, A_3$ ... are constants, and $S_1, S_2, S_3$ ... are input voltages.

13. The sigma-delta modulator of claim 12, wherein the sigma-delta modulator is a feed-forward modulator.

14. The sigma-delta modulator of claim 12, wherein the quantized signal is a multi-level quantized signal.

15. The sigma-delta modulator of claim 12, wherein each comparator of the plurality of comparators included in the multi-input quantizer comprises:

a first input and a second input, and an output;

a first plurality of resistors connected to the first input acting as a summing junction, wherein each resistor of the first plurality of resistors is connected to one of a corresponding reference voltage and a corresponding input voltage; and a second plurality of resistors connected to the second input acting as a summing junction, wherein each resistor of the second plurality of resistors is connected to one of a corresponding reference voltage and a corresponding input voltage.

16. The sigma-delta modulator of claim 12, wherein each comparator of the plurality of comparators included in the multi-input quantizer comprises:

a first plurality of inputs and a second plurality of inputs, and an output;

a first plurality of resistors connected between the first plurality of inputs and a first summing junction, wherein each resistor of the first plurality of resistors is connected to one of a corresponding reference voltage and a corresponding input voltage; and a second plurality of resistors connected between the second plurality of inputs and a second summing junction, wherein each resistor of the second plurality of resistors is connected to one of a corresponding reference voltage and a corresponding input voltage.

\* \* \* \* \*